(12) United States Patent
Ha

(10) Patent No.: US 6,451,708 B1
(45) Date of Patent: Sep. 17, 2002

(54) METHOD OF FORMING CONTACT HOLES IN A SEMICONDUCTOR DEVICE

(75) Inventor: Dae-Won Ha, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/670,493

(22) Filed: Sep. 26, 2000

(30) Foreign Application Priority Data

Sep. 27, 1999 (KR) .............................. 99-41370

(51) Int. Cl.[7] .................. H01L 21/302; H01L 21/8244; H01L 21/20
(52) U.S. Cl. ....................... 438/738; 438/239; 438/253; 438/396
(58) Field of Search ................................ 438/637, 199, 438/200, 201, 238, 396, 253, 254, 256, 257, 533, 582, 656, 657, 734, 723, 743, 926, 927, 735–738; 257/764, 915, 258

(56) References Cited

U.S. PATENT DOCUMENTS

| 5,801,443 | A | * | 9/1998 | Ohno .......................... 257/758 |
| 6,083,845 | A | * | 7/2000 | Yang et al. .................. 438/734 |
| 6,136,649 | A | * | 10/2000 | Hui et al. .................... 438/257 |
| 6,168,984 | B1 | * | 1/2001 | Yoo et al. .................... 438/239 |
| 6,218,272 | B1 | * | 4/2001 | Yeom et al. ................. 438/586 |
| 6,242,809 | B1 | * | 6/2001 | Lee ............................. 257/764 |
| 6,255,224 | B1 | * | 7/2001 | Lim .......................... 438/723 |
| 6,255,686 | B1 | * | 7/2001 | Takeuchi et al. ............. 257/306 |
| 6,271,087 | B1 | * | 8/2001 | Kinoshita et al. ........... 438/258 |
| 6,277,738 | B1 | * | 8/2001 | Choi et al. .................. 438/655 |
| 6,287,905 | B2 | * | 9/2001 | Kim et al. ................... 438/197 |
| 6,309,960 | B1 | * | 10/2001 | Sukekawa ................... 438/629 |

* cited by examiner

Primary Examiner—Wael Fahmy
Assistant Examiner—Brook Kebede
(74) Attorney, Agent, or Firm—Marger Johnson & McCollom, P.C.

(57) ABSTRACT

A method of forming bit line contact holes simultaneously in the cell array region and the peripheral circuit region through a single-step photolithographic process using an etching stop phenomenon. Bit line contact holes are formed to expose a contact pad in the cell array region, to expose impurity diffusion region and to expose a gate electrode of a transistor in the peripheral region. Bit line contact holes are formed by a two-step etching process. The first etching step etches selectively insulating layers against a capping nitride of a transistor in the peripheral region, using a predefined photoresist pattern, thereby forming a first bit line contact hole to the contact pad in the cell array region, a bit line contact hole to the impurity region in the peripheral and an opening to the capping layer in the peripheral region. The second etching step etches the capping nitride to expose the gate electrode, using the same photoresist pattern, while no further etching occurs at the first and second bit line contact holes due to its relatively high aspect ratio. As a result, bit line contact holes are simultaneously formed both at the cell array region and peripheral circuit regions by a single-step photolithographic process.

12 Claims, 7 Drawing Sheets

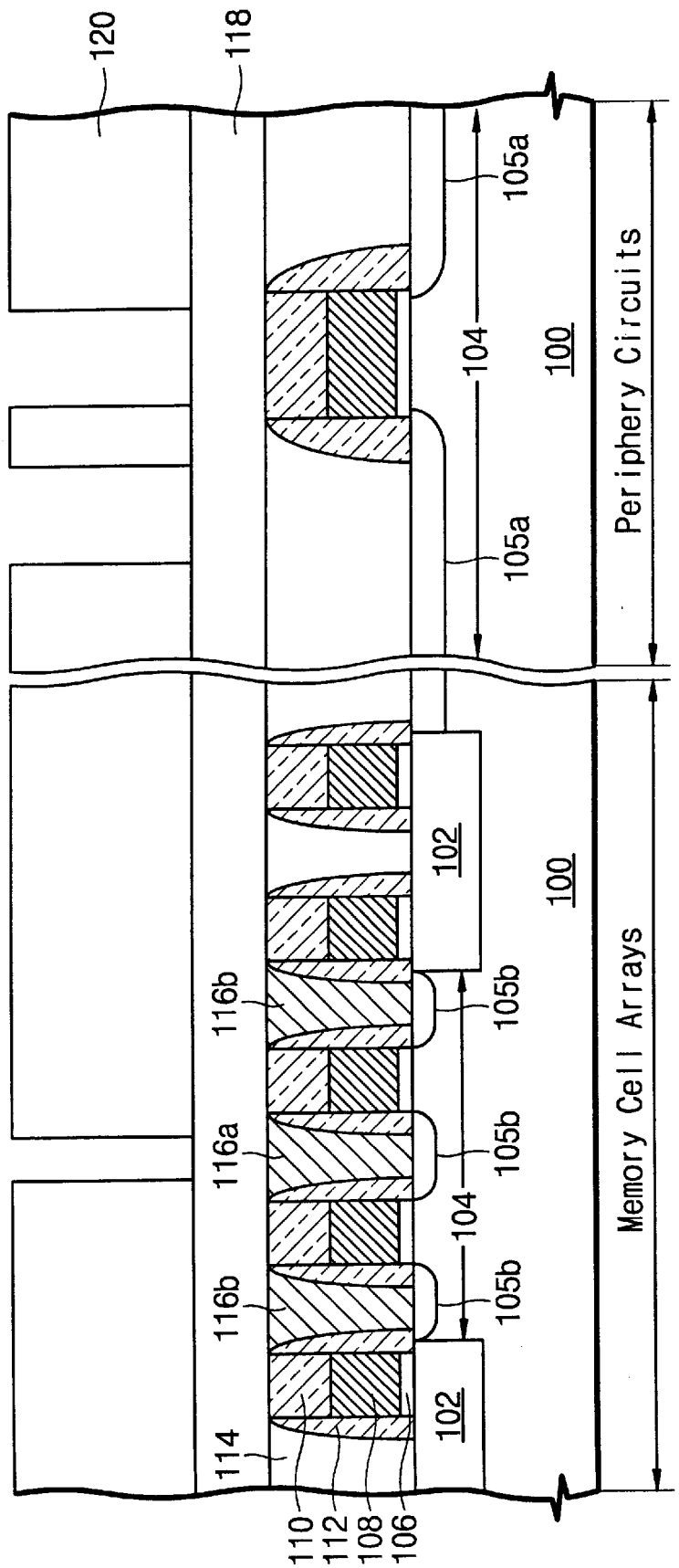

ated with the
METHOD OF FORMING CONTACT HOLES IN A SEMICONDUCTOR DEVICE

BACKGROUND OF THE INVENTION

1. Field of the Invention

The present invention relates to a method of forming contact holes in a semiconductor device, and more particularly to a method of forming contact holes in a cell array region and a peripheral region of a semiconductor device.

2. Description of the Related Art

In ULSI (Ultra Large Scale Integration) device fabrication, as design rules for semiconductor devices become smaller and smaller, sufficient alignment margin can hardly be secured, for example, when aligning a contact plug with a semiconductor layer or interconnect layer underlying the contact plug. Accordingly, for micron level semiconductor devices, a manufacturing process that permits the contact plug to be formed by self alignment with a semiconductor layer or interconnect layer underlying the contact plug is employed.

Thus, Self-aligned contact (SAC) techniques have been used to secure sufficient alignment margin by selectively etching one layer against another layer, e.g., selectively etching an oxide layer against a nitride layer. Such SAC techniques are mostly employed to form bit line contacts and storage node contacts. U.S. Pat. Nos. 5,670,404 and 5,430,328, et al, the disclosures of which are incorporated herein by reference, disclose SAC techniques for the formation of contact holes.

The continuing trends toward high-density devices require the formation of high aspect ratio contact holes in the cell array region. It is, however, very difficult to form high-aspect ratio contact holes by anisotropically etching oxide layers. To overcome the problems associated with the formation of high aspect ratio contact holes, contact pads are formed for bit line contacts and storage node contacts between the access transistors. Then bit line contacts and storage node contacts are formed in alignment with the underlying contact pads.

Semiconductor memory devices such as a dynamic random access memory (DRAM) or a static random access memory (SRAM), has a memory cell array and a peripheral circuit. In a DRAM device, a memory cell is provided for each bit of information stored by the DRAM device. Each memory cell typically consists of a storage capacitor and an access transistor. Either the source or drain of the access transistor is connected to one terminal of the capacitor. The other drain or source and the transistor gate electrode are connected to external connection lines called bit lines and word lines. The other terminal of the capacitor is connected to a reference voltage.

A peripheral circuit is provided to drive and control the memory cell array. MOS (metal-oxide-semiconductor) transistors in the peripheral circuit are connected to bit lines and local interconnections.

As is well known in the art, in the cell array region, bit line contact holes are formed in the oxide layer down to bit line contact pads. The contact pads are formed between the access transistors in the cell array region by selectively etching the oxide against the nitride comprising sidewall spacers and a capping layer of the access transistor. In the peripheral region, some bit line contact holes are formed in the oxide layer to expose the impurity diffusion region of the MOS transistor, and other bit line contact holes are formed in the oxide layer and the capping nitride layer of the MOS transistor to expose the gate electrode of the MOS transistor. Bit line contact processing in the cell array region uses an etching recipe that etches oxide selectively against the capping and sidewall spacer nitride layers. But, bit line contact holes exposing the gate electrode in the peripheral circuit region requires an etching recipe that etches the oxide and capping nitride layers without etch selectivity therebetween.

Accordingly, if bit line contact holes are formed through a single photolithography process step, some problems can be encountered. For example, misalignment in the cell array region can etch the capping nitride layer of an access transistor in the cell array region when bit line contacts to the gate electrode of the MOS transistor in the peripheral region is formed. This increases shorts between the gate electrode and bit lines in the cell array region. Furthermore, since the cell array region and the peripheral region require different etching conditions, it can be very difficult to control the end point of an etching process. This in turn can undesirably etch the underlying layer exposed by the contact holes.

For this reason, conventionally, bit line contact holes are formed by a two-step photolithographic process. One method is described as follows: The first photolithographic process step forms bit line contact holes in the cell array region to expose the bit line contact pads by selectively etching the oxide layer against the capping nitride layer. The second photolithographic process step forms bit line contact holes in the peripheral circuit region to expose the silicon substrate (i.e., impurity diffusion regions) and the polysilicon (or polycide) of the MOS transistor by the etching the oxide layer and the capping nitride layer, respectively, without an etching selectivity therebetween. An alternative method is described as follows: The first photolithographic process step forms bit line contact holes to expose bit line contact pads in the cell array region and to expose the silicon substrate in the peripheral region by etching the oxide layer selectively against the nitride capping layer and the sidewall spacers formed of nitride. Then the second photolithographic process step forms bit line contact holes to expose the polysilicon (or polycide) of the MOS transistor in the peripheral region. U.S. Pat. Nos. 5,895,239 and 5,918,120 disclose a method for fabricating a DRAM device having a COB (capacitor over bit line) structure.

The above-mentioned methods requiring a two-step photolithographic process is relatively complex and expensive. Also, controlling the end point detection during the etching process can be difficult.

Thus, it is desirable to reduce the required photolithographic process steps to form contact holes.

SUMMARY OF THE INVENTION

Therefore, it is an object of the present invention to provide a method of forming bit line contact holes concurrently in the cell array region and the peripheral circuit region through a single-step photolithographic process.

According to the present invention, when bit line contact to a gate electrode of a MOS transistor in the peripheral circuit region is completed (i.e., when the capping nitride layer of the MOS transistor is etched), no further etching is performed (so called "etching stop phenomenon") in the previously-formed bit line contact holes to bit line contact pads in the cell array region and to impurity diffusion region of MOS transistor in the peripheral region. Such an etching stop phenomenon results from the difference in the aspect ratios among contact holes. The aspect ratio of the contact holes to the bit line contact pads in the cell array region and the impurity diffusion region in the peripheral circuit region is greater than that of the bit line contact holes to the MOS transistors in the peripheral circuit region. If the aspect ratio of the contact hole is about 4 or more, substantially no further etching occurs. Accordingly, additional etching to the selected contact holes can be performed to complete the contact holes in the desired layers without unwanted etching of the layer exposed by the contact holes having an aspect ratio of 4 or more.

In accordance with one aspect of the present invention, a method of forming bit line contact holes is provided. The method comprises forming a first transistor in the cell array region and a second transistor in the peripheral region of a semiconductor substrate. Each of the transistors is made of a gate electrode with a capping layer thereon, a source/drain region adjacent the gate electrode and a sidewall spacer on the sidewalls of the transistor. The capping layer and sidewall spacer is formed of nitride. A first insulating layer is formed on the semiconductor substrate including the first and second transistors. The first insulating layer is formed of a material that has an etching selectivity against the capping and sidewall spacer nitride layers.

As an example, an oxide can be used. Conductive pads are formed to electrically connect to the source/drain region of the first transistor through the first insulating layer. The conductive pads are formed by selectively etching the first insulating layer against the nitride layers to form self-aligned contact holes, which exposes the substrate between adjacent first transistors. Then, a conductive material is deposited in the self-aligned contact holes and on the first insulating layer. Next, the conductive material is planarized to form the conductive pads. A second insulating layer is formed over the first insulating layer including the conductive pads and first and second transistors. The second insulating layer is formed of a material, such as an oxide, which has an etching selectivity against the nitride layer. First, second and third contact holes or openings are formed to expose a top surface of the semiconductor substrate (i.e., source/drain region of the second transistor) in the peripheral region, a top surface of the gate electrode of the second transistor in the peripheral region, and a top surface of the conductive pads in the cell array region, respectively.

More particularly, the first and second insulating layers are first-selectively etched against the capping and sidewall spacer nitride layers using a mask pattern, to form the first and third contact holes that respectively expose the top surface of source/drain region of the second transistor and the top surface of the conductive pad in the cell array region. This step also forms a second contact opening that exposes a top surface of the capping layer of the second transistor. It is preferable that an aspect ratio of the first and third contact holes is at least 4 and an aspect ratio of the second contact opening is less than 4. Then, the exposed capping layer of the second transistor in the peripheral region is second-etched using the same mask pattern until the top surface of the gate electrode of the second transistor is exposed, to complete the second contact holes. No further etching occurs in the first and third contact holes due to a high aspect ratio of 4 or more. Accordingly, first, second and third contact holes to the source/drain region of the second transistor, to the gate electrode of the second transistor and to the conductive pad can be concurrently formed using a single-step photolithographic process.

Preferably, the first-selectively etching of the first and second insulating layers against the capping layer and sidewall spacers uses a mixed gas containing $C_4H_8$, CO and argon, and the second-etching of the exposed capping layer uses a mixed gas containing a $CHF_3$, CO and argon. Alternatively, the first-selectively etching uses a mixed gas containing $C_4H_8$, CO and argon, and the second-etching uses a mixed gas containing a $CHF_3$, CO and $O_2$.

BRIEF DESCRIPTION OF THE DRAWINGS

The above features and advantages of the invention will become apparent upon reference to the following detailed description of specific embodiments and the attached drawings, of which:

FIGS. 2A to 2F are cross-sectional diagrams of a semiconductor substrate, at selected stages of a method of forming a bit line contact according to the present invention.

DETAILED DESCRIPTION OF THE PREFERRED EMBODIMENTS

Figure 1:
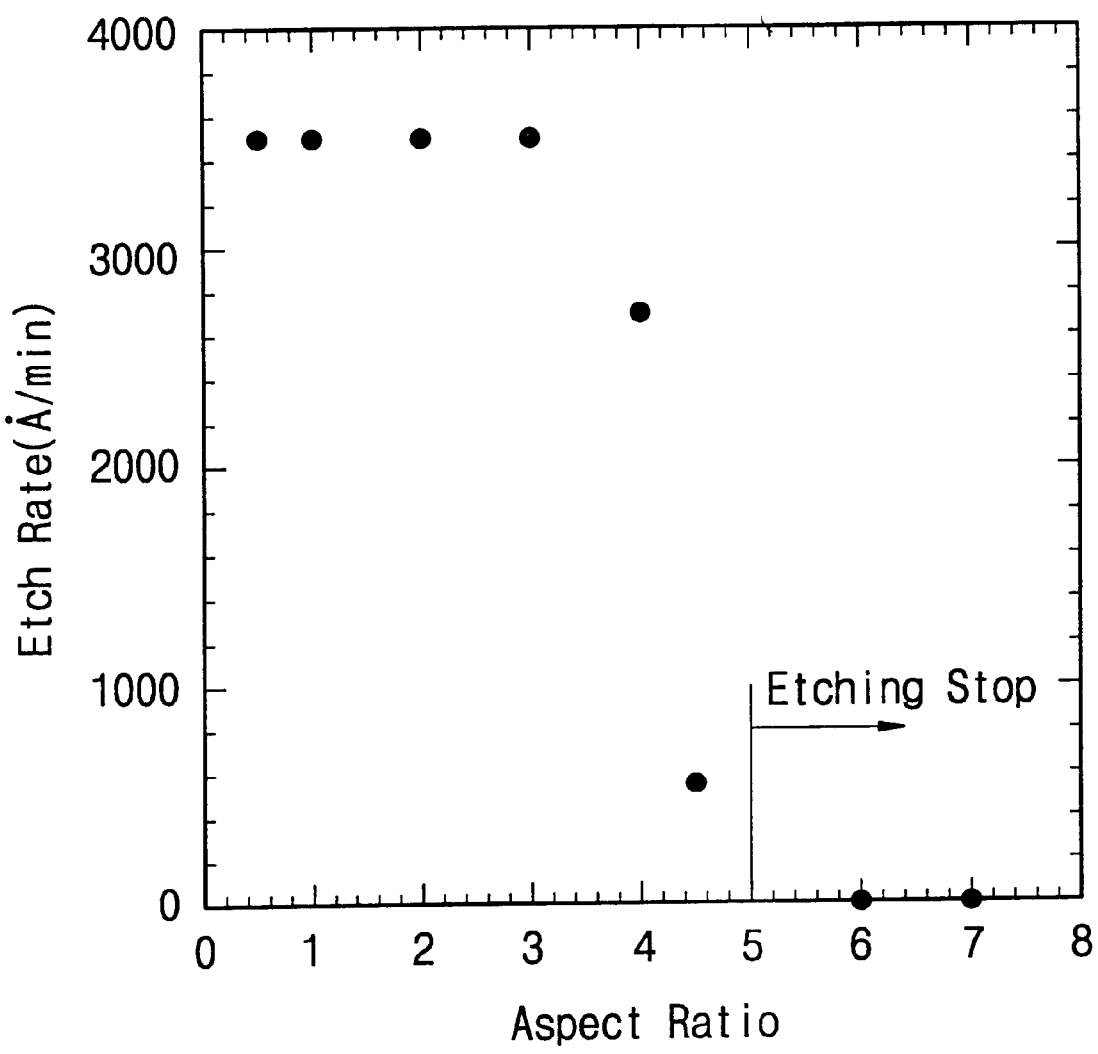
FIG. 1 graphically represents the relationship between the aspect ratio of the contact and the etching rate.

For better understanding of the present invention, there is provided FIG. 1, which was obtained by varying an aspect ratio using an identical etching recipe. FIG. 1 schematically shows the relationship between an etch rate and the aspect ratio of a contact hole. As can be seen in FIG. 1, the etch rate is reverse proportional to the aspect ratio. When the aspect ratio increases from about 3 to about four (4), the etch rate significantly decreases, and substantially no further etch occurs at about 4 (so called "etching stop phenomenon").

Consequently, using such an etching stop phenomenon, contact holes, requiring a different etching recipe, i.e., a first contact hole only in a second insulating layer and a second contact hole in the second insulating layer and the underlying first insulating layer, can be simultaneously formed through a single-step photolithography process, wherein the first and second insulating layer have etching selectivity with respect to each other. The second insulating layer is etched selectively against the first insulating layer, to form the first contact hole and to form a second contact opening. Herein, the first contact hole is formed to have an aspect ratio of at least four (4) and the second contact opening is formed to have an aspect ratio of less than four (4). Accordingly, when further etching proceeds without an additional mask, etching occurs only in the second contact opening to etch the first insulating layer, thereby forming a second contact hole, while substantially no etching occurs in the first contact hole due to its high aspect ratio of at least four (4).

Hereinafter, a preferred embodiment of the present invention using the etching stop phenomenon will now be described more fully with reference to the accompanying drawings. More particularly, the present invention is directed to providing a method of forming bit line contact holes simultaneously both at the cell array region and peripheral circuit regions by a single-step photolithographic process. However, the present invention can be applied into any contact holes formation with different aspect ratio one another. In the drawings, the thickness of layers and regions are exaggerated for clarity. It should also be understood that when a layer is referred to as being "on" or "over" another layer or substrate, it can be directly on the other layer, or substrate or intervening layers may also be present. Moreover, each embodiment described and illustrated herein includes its complementary conductivity type embodiment as well, all within the spirit and scope of the invention.

Figure 2A:
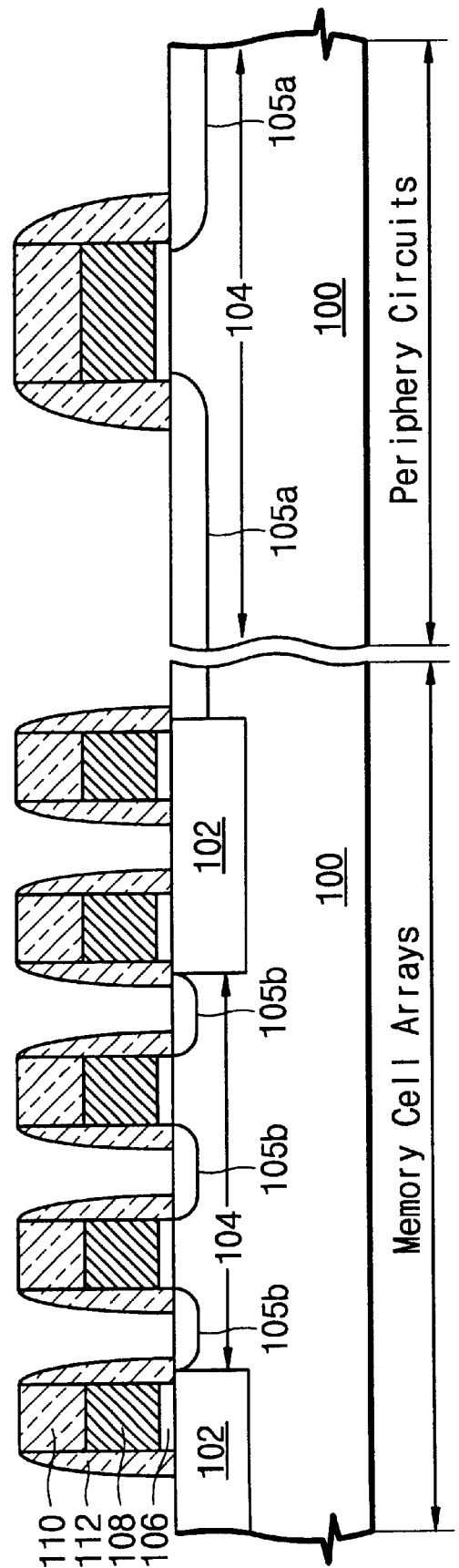

Referring now to FIG. 2A, there is provided a semiconductor substrate 100 where several process steps are performed according to the present invention. The semiconductor substrate 100 may be typically divided into cell array region and peripheral circuit region. The cell array region is made of a plurality of memory cell arrays and the peripheral circuit region is provided to drive and control the memory cell arrays.

Active regions 104 and inactive regions are defined by device isolation regions 102. The active region 104 is the region to which electrical connection is to be made. The device isolation process can be a LOCOS (local oxidation of silicon) technique or a STI (shallow trench isolation) technique. Other suitable processes can be also employed.

After defining the active regions 104, a transistor formation process is carried out. A gate oxide layer 106 is grown on substrate 100 for electrical separation between the substrate 100 and gate electrode of the transistor to a thickness of about 30 to 60 angstroms. A gate electrode layer 108 of about 1,500 to 2,000 angstroms and a gate capping layer 110 of about 1,000 to 2,000 angstroms are deposited on the gate oxide layer. The stacked layers are then patterned into a predetermined configuration, i.e., spaced apart gate electrode structures of overall thickness less than 4,000 angstroms, preferably about 3,600 angstroms. After forming the gate electrode structures, conventional ion implanting process is used to form impurity diffusion regions, i.e., source/drain regions, within the substrate 100 outside of the gate electrode structures. Then, sidewall spacers 112 are formed on the sidewalls of the gate electrode structures to complete access transistors in the cell array region and MOS transistors in the peripheral region.

Preferably, the gate electrode may be made of a double layer of polysilicon and metal silicide. Metal silicide may comprise tungsten silicide and/or titanium silicide. The gate capping layer 110 and sidewall spacers 112 are made of a nitride layer which has an etching selectivity with respect to an insulating layer that is to be formed in spaces between the gate electrode structures with spacers.

Figure 2B:
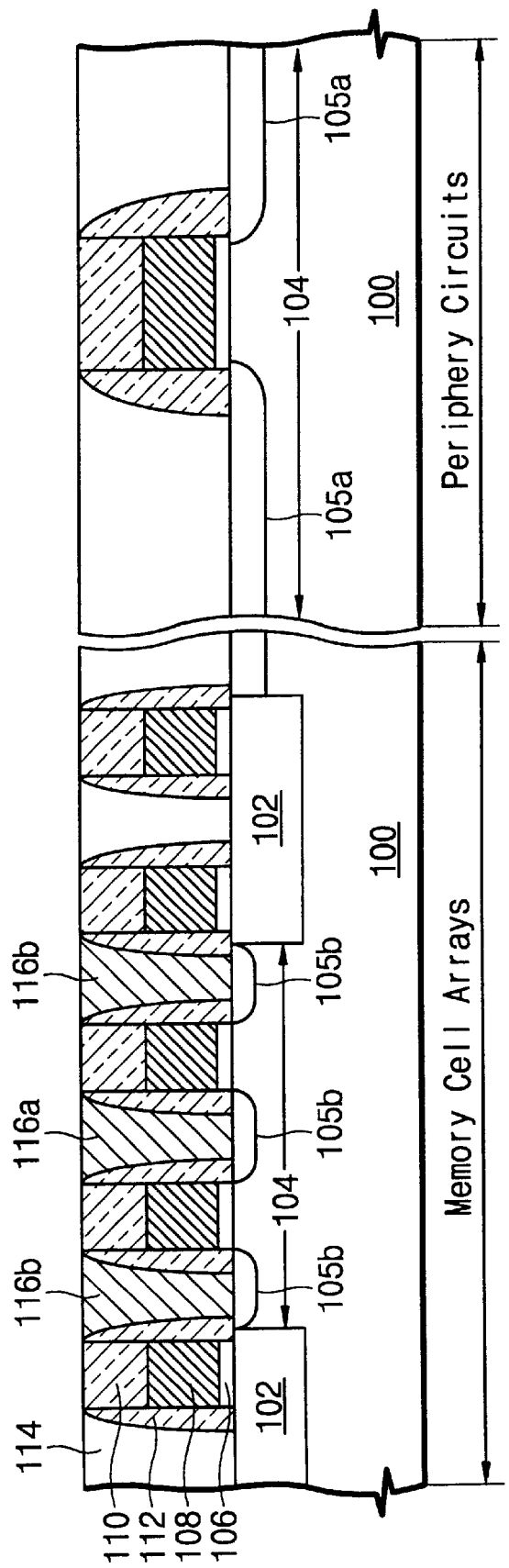

Next, contact pads 116 are formed in the cell array region as shown in FIG. 2B. More particularly, a first insulating layer 114 that has an etching selectivity with respect to the capping and sidewall spacer nitride layers 110 and 112 is formed to fill the spaces between the transistors. The first insulating layer 114 may be made of an oxide layer to a thickness of about 1,000 angstroms over the transistors. Using photolithography, selected portions of the first insulating layer 114 are etched to form contact holes in the first insulating layer. During this photolithography process, the first insulating layer is selectively etched with respect to the capping and sidewall nitride layer to form contact holes (a so-called self-aligned contact or SAC process). Next, a conductive material such as doped polysilicon is formed on the first insulating layer to fill the contact holes. Then a planarization process is carried out on the conductive layer and the first insulating layer until a top surface of the transistor (i.e., the capping nitride layer) is exposed, thereby forming contact pads 116a (storage node contact pad) and. 116b (bit line contact pad) that are electrically isolated from each other.

Figure 2D:
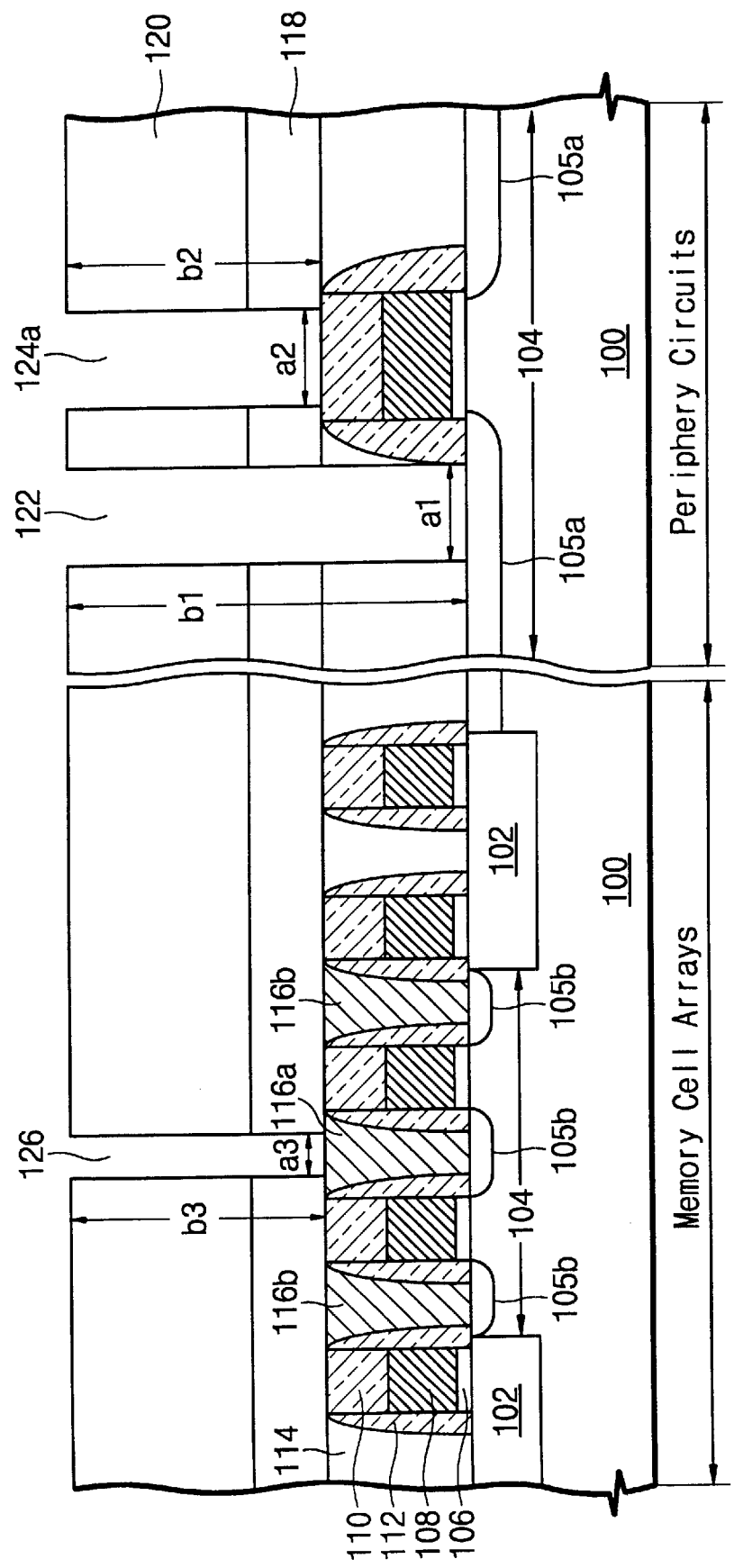
Figure 2E:
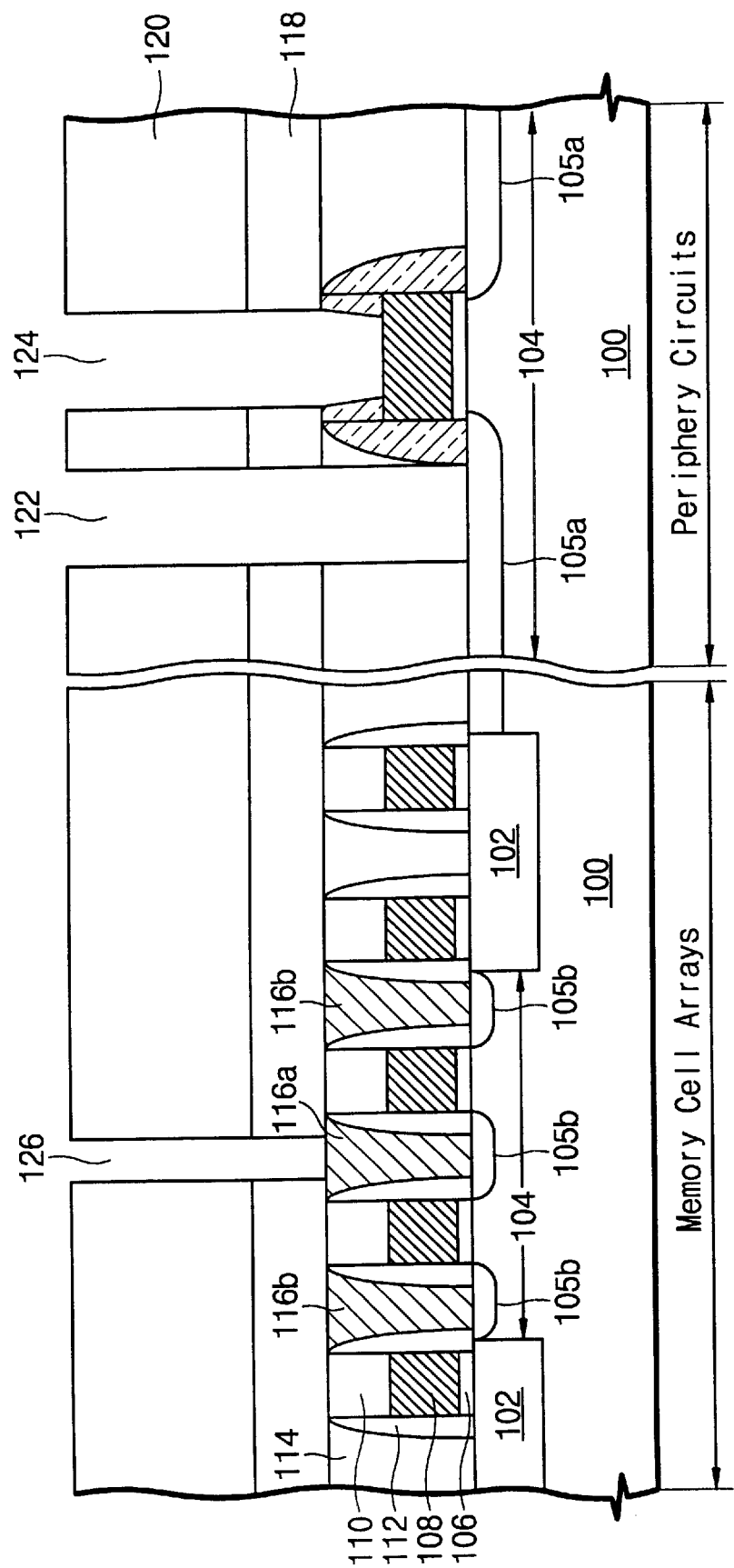

Formation of bit line contact holes in the cell array region and peripheral circuit region by a single-step photolithographic process is next addressed and schematically shown in FIGS. 2C through 2E. The eching of bit line contact holes includes a two-step etching process, i.e., a first step of selectively etching insulating layers 118 and 114 against capping and sidewall nitride layers 110 and 112, and a second step of selectively etching the exposed capping nitride layer 110 using the etching stop phenomenon.

More particularly, referring now to FIG. 2C, a second insulating layer 118 is formed to a thickness of about 1,200 angstroms on the resulting structure shown in FIG. 2B. The second insulating layer 118 is formed of oxide. A photoresist layer is spin coated and patterned into a photoresist layer pattern 120 (i.e., a mask pattern to have a thickness of about 5,000 angstroms on the second insulating layer 118. Using the patterned photoresist layer 120 as an etching mask, the first etching step is carried out to selectively etch the underlying first and second oxide layers 114 and 118 against the nitride layers and polysilicon, thereby forming a first bit line contact hole 122 (See FIG. 2D) having an aperture size of about 1,700 angstroms to the source/drain region 105a of the MOS transistor in the peripheral region, a second opening 124a having an aperture size of about 1,800 angstroms down to a top surface of the MOS transistors (i.e., the capping nitride layer) in the peripheral circuit region, and a third bit line contact hole 126 having an aperture size of about 1,000 angstroms down to the bit line contact pad 116a in the cell array region, as shown in FIG. 2D.

The first etching step uses a mixed gas containing $C_XF_Y$ such as $C_4F_8$, CO (carbon monoxide) and an inert gas such argon with a flow rate of about 1:10~15:15~20 therebetween. The first etching step selectively etches the second and first insulating layers 118 and 114 and resulting first and third bit line contact holes 122 and 126 have an aspect ratio at least 5 and the second opening 124a has an aspect ratio less than 5.

More particularly, the aspect ratio resulting from the first step of etching is as follows. The first bit line contact hole 122 has an aspect ratio ($=b_1/a_1$) of about 5.76 and the second opening 124a has an aspect ratio ($=b_2/a_2$) of about 3.33 and the third bit line contact hole 126 has an aspect ratio ($=b_3/a_3$) of about 6.20.

For better understanding of the present invention, there is provided Table 1 which shows the bit line contact dimension and the layer to be etched.

TABLE 1

| | critical dimension of the opening | etched amount of the oxide layer | etched amount of the photoresist layer | aspect ratio |
| --- | --- | --- | --- | --- |
| first bit line contact hole 122 | about 1,700 angstroms | about 4,800 angstroms first and second oxide layers | about 5,000 angstroms | about 5.76:1 |
| second intermediate opening 124b | about 1,800 angstroms | about 1,200 angstroms second oxide layer | about 5,000 angstroms | about 3.33:1 |
| third bit line contact hole 126 | about 1,000 angstroms | about 1,200 angstroms second oxide layer | about 5,000 angstroms | about 6.20:1 |

After the first etching step, the second etching step is carried out on the exposed capping nitride by the second opening 124a to form a second bit line contact hole 124 as shown in FIG. 2E. During this second etching step, no further etching occurs on the exposed bit line contact pad 116a and source/drain regions 105 by the third and first contact holes 126 and 122 respectively due to the etching stop phenomenon. This is because, as can be seen in FIG. 1, when the aspect ratio of contact hole is 4 or more, e.g., about 5,76 and 6.20, substantially no etching occurs in the contact holes 122 and 126. However, since the second opening 124a has an aspect ratio of less than 4, e.g., 3.33, the etching process advantageously proceeds to form the desired second bit line contact hole 124. The second etching step etches selectively the capping nitride layer with the use of a mixed gas containing $CHF_3$, CO and Ar (argon) with a flow rate of about 1:1.5~2.5:10. Alternatively a mixed gas containing $CHF_3$, CO and $O_2$ with a flow rate of about 9~10:25:1 can be used.

The aspect ratio of the contact hole can be adjusted by controlling the thickness of the first and second insulating layer, and also the thickness of the photoresist layer and the aperture size of the contact hole. Therefore, those skilled in the art will readily be able to vary these parameter (thickness of the insulating layers and the photoresist layer and dimension of the contact hole) to suit their circumstance.

Figure 2F:
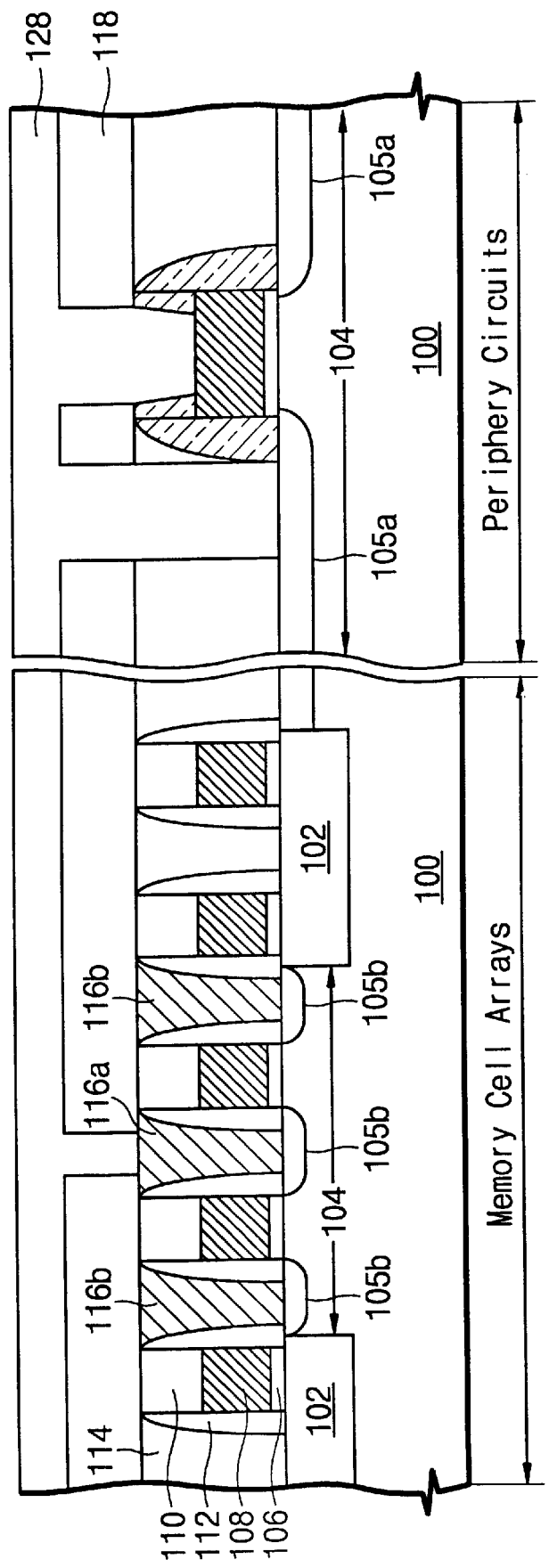

After forming the bit line contact holes, the patterned photoresist layer 120 is removed through conventional ashing and stripping process. After removing the patterned photoresist layer 120, a conductive material 128 is deposited in the contact hole and on the second insulating layer 118, as shown in FIG. 2F, to form a bit line.

Thus, the present invention utilizes an etching stop phenomenon in order to simultaneously form bit line contact holes in both the cell array region and the peripheral region. The formation of the bit line contact holes includes a two-step etching process using a single-step photolithographic process. The first etching step etches selectively insulating layers against a capping nitride layer of a transistor in a peripheral region with a predefined photoresist pattern. The second etching step etches the capping nitride layer with the same photoresist pattern utilizing the etching stop phenomenon with respect to other area. As a result, bit line contact holes are simultaneously formed both at the cell array region and peripheral circuit regions by a single-step photolithographic process.

This invention may be embodied in different forms and should not be construed as limited to the embodiments set forth herein. Rather, these embodiments are provided so that this disclosure will be thorough and complete, and will fully convey the scope of the invention to those skilled in the art.

What is claimed is:

1. A method of forming contact holes on a gate electrode and conductive regions of a semiconductor substrate using a single-step photolithographic process, first and second insulating layers being formed over the gate electrode, the first insulating layer having an etching selectivity with respect to the second insulating layer, the second insulating layer being formed over one of the conductive regions, the method comprising:
   forming a photoresist pattern over the second insulating layer;
   first selectively etching the second insulating layer with an etch chemistry having an etching selectivity with respect to the first insulating layer, using the photoresist pattern as an etching mask, thereby forming a first contact hole that exposes the one of the conductive regions and to form an opening that exposes the first insulating layer overlying the gate electrode; and
   second selectively etching the exposed first insulating layer using the same photoresist pattern and the opening until the gate electrode is exposed, to form a second contact hole.

2. The method according to claim 1, wherein an aspect ratio of the first contact hole is at least 4 and an aspect ratio of the opening is less than 4, so that the exposed one of the conductive regions by the first contact hole is not etched during the second selectively etching of the exposed first insulating layer using the same photoresist pattern and the opening as an etching mask.

3. A method of forming contact holes, using a single-step photolithographic process in both a cell array region and a peripheral region of a semiconductor substrate, the method comprising:
   forming a first transistor and a second transistor in the cell array region and the peripheral region, respectively, each of the transistors including a gate electrode, a capping layer thereon, a source/drain region adjacent the gate electrode and a sidewall spacer on sidewalls of the gate electrode;
   forming a first insulating layer on the substrate and on the transistors;
   forming a conductive pad to be electrically connected to the source/drain region of the first transistor through the first insulating layer;
   forming a second insulating layer on the conductive pad, the first insulating layer and the transistor; and
   forming first, second and third contact holes to respectively expose the source/drain region of the second transistor, the gate electrode of the second transistor, and the conductive pad using a two-step etching process utilizing etching stop phenomenon with a single etching mask.

4. The method according to claim 3, wherein the capping layer and the sidewall spacer are formed of nitride and the first and second insulating layers are formed of oxide.

5. The method according to claim 3, wherein the two step etching utilizing etching stop phenomenon comprises:
   forming a photoresist layer on the second insulating layer;
   patterning the photoresist layer to form a photoresist pattern;
   first selectively etching the first and second insulating layers, using the photoresist pattern, against the capping layer and the sidewall spacer, to form the first and third contact holes, and to form an opening which exposes a top surface of the capping layer of the second transistor,
   wherein an aspect ratio of the first and third contact holes is at least 4 and an aspect ratio of the second bit line opening is less than 4; and
   second etching the exposed capping layer of the second transistor in the peripheral region, using the same photoresist pattern, until the top surface of the gate electrode of the second transistor is exposed, to form the second contact hole.

6. The method according to claim 5, further comprising forming a conductive material on the second insulating layer filling the first, second and third contact holes and patterning the conductive material.

7. The method according to claim 5, wherein the first and second insulating layers comprise an oxide and the capping layer and the sidewall spacer comprise a nitride, and the first step of selectively etching uses a mixed gas containing $C_4H_8$, CO and argon, and the second step of etching the exposed capping layer uses a mixed gas containing a $CHF_3$, CO and argon.

8. The method according to claim 5, wherein the first and second insulating layers comprise an oxide and the capping layer and the sidewall spacer comprise a nitride, and the first step of selectively etching uses a mixed gas containing $C_4H_8$, CO and argon, and the second step of etching the exposed capping layer uses a mixed gas containing a $CHF_3$, CO and $O_2$.

9. A method of forming bit line contact holes in simultaneously both a cell array region and a peripheral region of a semiconductor substrate, the method comprising;

forming a first transistor and a second transistor in the cell array region and the peripheral region, respectively, each of the transistors including a gate electrode, a capping layer thereon, a source/drain region adjacent the gate electrode and a sidewall spacer on sidewalls of the gate electrode;

forming a first insulating layer on the substrate and on the transistors;

forming a conductive pad to be electrically connected to the source/drain region of the first transistor by etching the first insulating layer, depositing a conductive material and planarizing the first insulating layer and the conductive material until a top surface of the transistor is exposed;

forming a second insulating layer on the transistors, the conductive pad and the first insulating layer;

forming a photoresist layer on the second insulating layer;

patterning the photoresist layer to form a photoresist pattern;

first etching the resulting structure, using the photoresist pattern, to form a first bit line contact hole to the source/drain region of the second transistor, a second bit line contact hole to a top surface of the capping layer of the second transistor, and a third bit line contact hole to a top surface of the conductive pad of the cell array region, wherein an aspect ratio of the first and third contact hole is at least 4 and an aspect ratio of the second contact hole is less than 4; and second etching the exposed capping layer by the second contact hole, using the same photoresist pattern, until a top surface of the gate electrode of the second transistor is exposed.

10. The method according to claim 9, wherein the first and second insulating layers comprise an oxide and the capping layer and the sidewall spacer comprise a nitride, wherein the first etching selectively etches the first and second insulating layers with respect to the capping layer and the sidewall spacer, wherein the second etching depends on the aspect ratio so that the second etching etches the exposed capping layer of the second transistor by the second bit lines contact opening having an aspect ratio of less than 4 but no etching occurs in the first and third bit line contact holes having an aspect ratio of at least 4.

11. The method according to claim 10, wherein the first step of selectively etching uses a mixed gas containing $C_4H_8$, CO and argon, and the second step of etching the exposed capping layer uses a mixed gas containing a $CHF_3$, CO and argon.

12. The method according to claim 10, wherein the first step of selectively etching uses a mixed gas containing $C_4H_8$, CO and argon, and the second step of etching the exposed capping layer uses a mixed gas containing a $CHF_3$, CO and $O_2$.

* * * * *